(12) United States Patent
Zheleznyak et al.

(10) Patent No.: US 11,137,356 B2
(45) Date of Patent: Oct. 5, 2021

(54) SYSTEM AND METHOD OF CLEAVING OF BURIED DEFECTS

(71) Applicant: SELA Solutions EnabLing nano Analytics Ltd., Yokneam (IL)

(72) Inventors: Vladimir Zheleznyak, Qiryat Motzkin (IL); Anatoli Eizner, Haifa (IL)

(73) Assignee: SELA SEMICONDUCTOR ENGINEERING LABORATORIES LTD., Yokneam (IL)

( * ) Notice: Subject to any disclaimer, the term of this patent is extended or adjusted under 35 U.S.C. 154(b) by 17 days.

(21) Appl. No.: 16/179,736

(22) Filed: Nov. 2, 2018

(65) Prior Publication Data

US 2019/0242829 A1    Aug. 8, 2019

Related U.S. Application Data

(60) Provisional application No. 62/581,042, filed on Nov. 3, 2018.

(51) Int. Cl.

| | |
|---|---|
| *G01N 21/88* | (2006.01) |
| *B28D 5/00* | (2006.01) |
| *H01L 21/67* | (2006.01) |
| *G06T 7/00* | (2017.01) |
| *G01N 21/95* | (2006.01) |

(52) U.S. Cl.
CPC ....... *G01N 21/8806* (2013.01); *B28D 5/0005* (2013.01); *B28D 5/0023* (2013.01); *B28D 5/0064* (2013.01); *B28D 5/0082* (2013.01); *G01N 21/9505* (2013.01); *G06T 7/0004* (2013.01); *H01L 21/67288* (2013.01); *G06T 2207/10048* (2013.01); *G06T 2207/30148* (2013.01)

(58) Field of Classification Search
CPC .......... G01N 21/8806; G01N 21/9505; B28D 5/0023; B28D 5/0064; B28D 5/0005
See application file for complete search history.

(56) References Cited

U.S. PATENT DOCUMENTS

| | | | | |
|---|---|---|---|---|
| 5,656,811 A | * | 8/1997 | Itoh | G01N 1/32 850/43 |
| 5,696,835 A | * | 12/1997 | Hennessey | H01L 21/681 348/86 |
| 5,981,949 A | * | 11/1999 | Leahy | G01N 21/9505 250/332 |
| 5,985,680 A | * | 11/1999 | Singhal | G01N 21/94 356/614 |

(Continued)

*Primary Examiner* — Jonathan G Riley
(74) *Attorney, Agent, or Firm* — Reches Patents

(57) ABSTRACT

A method for exposing a buried defect, the method may include illuminating, by a radiation source, an object that comprises the buried defect, with illuminating radiation that passes through radiation transparent part of a chuck, while the object is supported by the chuck; detecting, by a sensor, a detected radiation that passed through the object, to provide a visual indication about the buried defect, wherein the visual indication is indicative of a location of the buried defect; setting, based on the location of the buried object and a spatial relationship between a cleaving element and the sensor, a cleaving axis of a cleaving element to virtually cross the buried defect; and cleaving, by the cleaving element, the object to expose the buried object.

14 Claims, 9 Drawing Sheets

(56) References Cited

U.S. PATENT DOCUMENTS

| | | | | |
|---|---|---|---|---|
| 6,140,603 | A * | 10/2000 | Hwang | H01L 21/3043 219/121.69 |
| 6,205,239 | B1 * | 3/2001 | Lin | G01N 21/95607 257/E21.525 |
| 6,271,102 | B1 * | 8/2001 | Brouillette | B23D 59/002 257/E21.518 |
| 6,292,582 | B1 * | 9/2001 | Lin | G01N 21/95607 257/E23.179 |
| 6,362,475 | B1 * | 3/2002 | Bindell | G01N 1/32 250/307 |
| 8,213,704 | B2 * | 7/2012 | Peterson | G03F 7/70666 382/145 |
| 8,290,239 | B2 * | 10/2012 | Noy | H05K 3/225 382/141 |
| 9,659,670 | B2 * | 5/2017 | Choi | G11C 29/56008 |
| 10,718,900 | B2 * | 7/2020 | Shaw | H01L 21/67092 |
| 2005/0231713 | A1 * | 10/2005 | Owen | G01N 21/8806 356/237.1 |
| 2008/0153186 | A1 * | 6/2008 | Saito | H01L 22/24 438/16 |
| 2010/0015735 | A1 * | 1/2010 | Hsieh | G01B 15/00 438/16 |
| 2014/0038392 | A1 * | 2/2014 | Yonehara | B81C 1/0038 438/463 |
| 2014/0041217 | A1 * | 2/2014 | Ito | G01J 3/4412 29/846 |
| 2015/0144968 | A1 * | 5/2015 | Herner | B23K 26/53 257/79 |
| 2016/0056606 | A1 * | 2/2016 | Chuang | H01S 3/302 355/67 |
| 2017/0045463 | A1 * | 2/2017 | Wenz | G01N 21/474 |
| 2019/0210155 | A1 * | 7/2019 | Baer | B23K 26/08 |
| 2020/0126860 | A1 * | 4/2020 | Sakamoto | H01L 21/6836 |
| 2020/0176314 | A1 * | 6/2020 | Sherbin | B23K 26/364 |

* cited by examiner

FIG. 1, Perspective view of wafer substrate defect
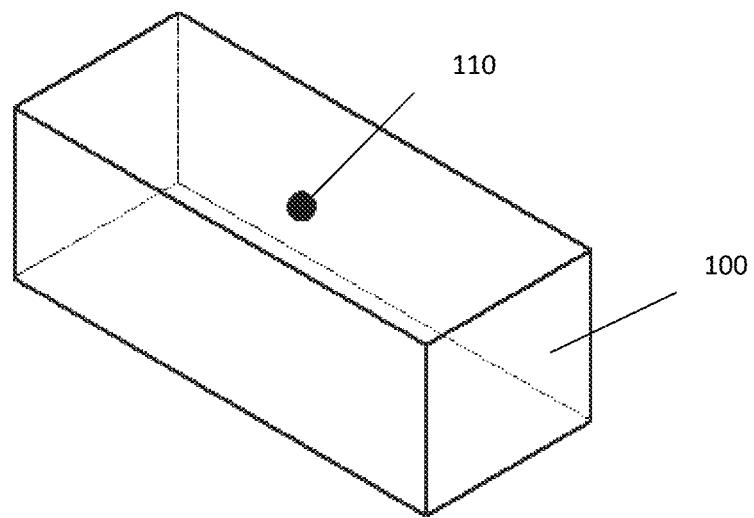

Fig.2, Perspective view of defect in lithography layers on silicon substrate
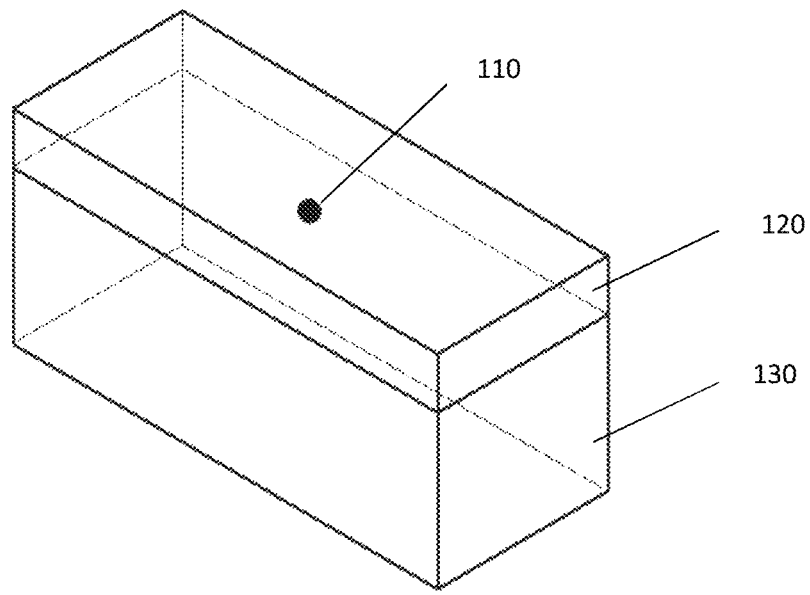
Fig.3, Perspective view of defect in multi-stack semiconductor device
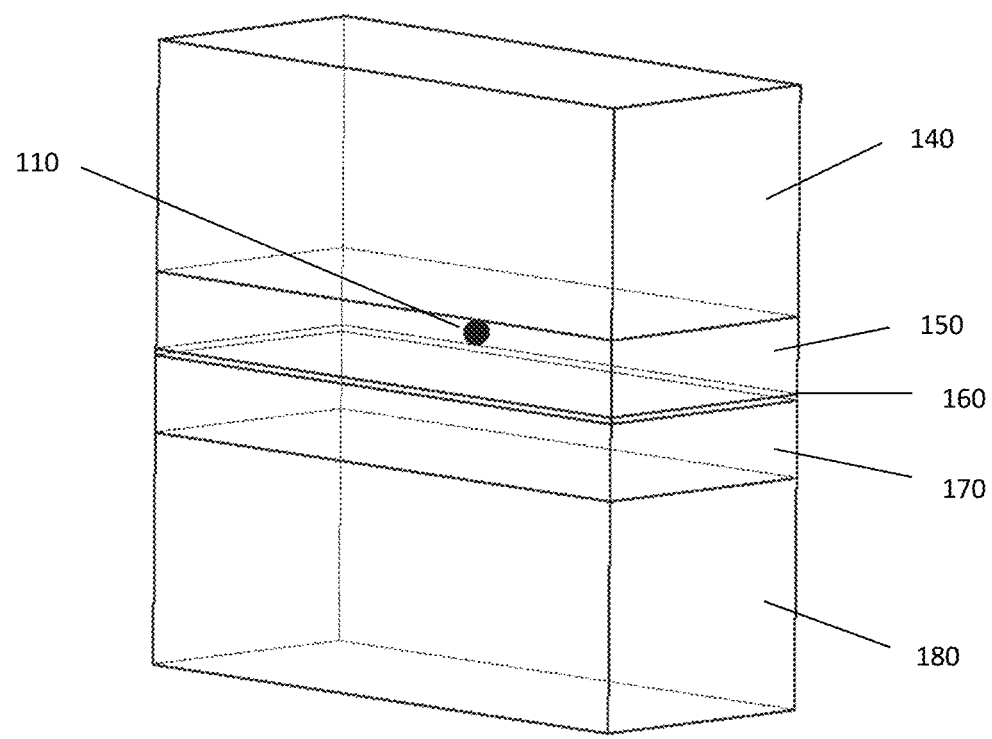

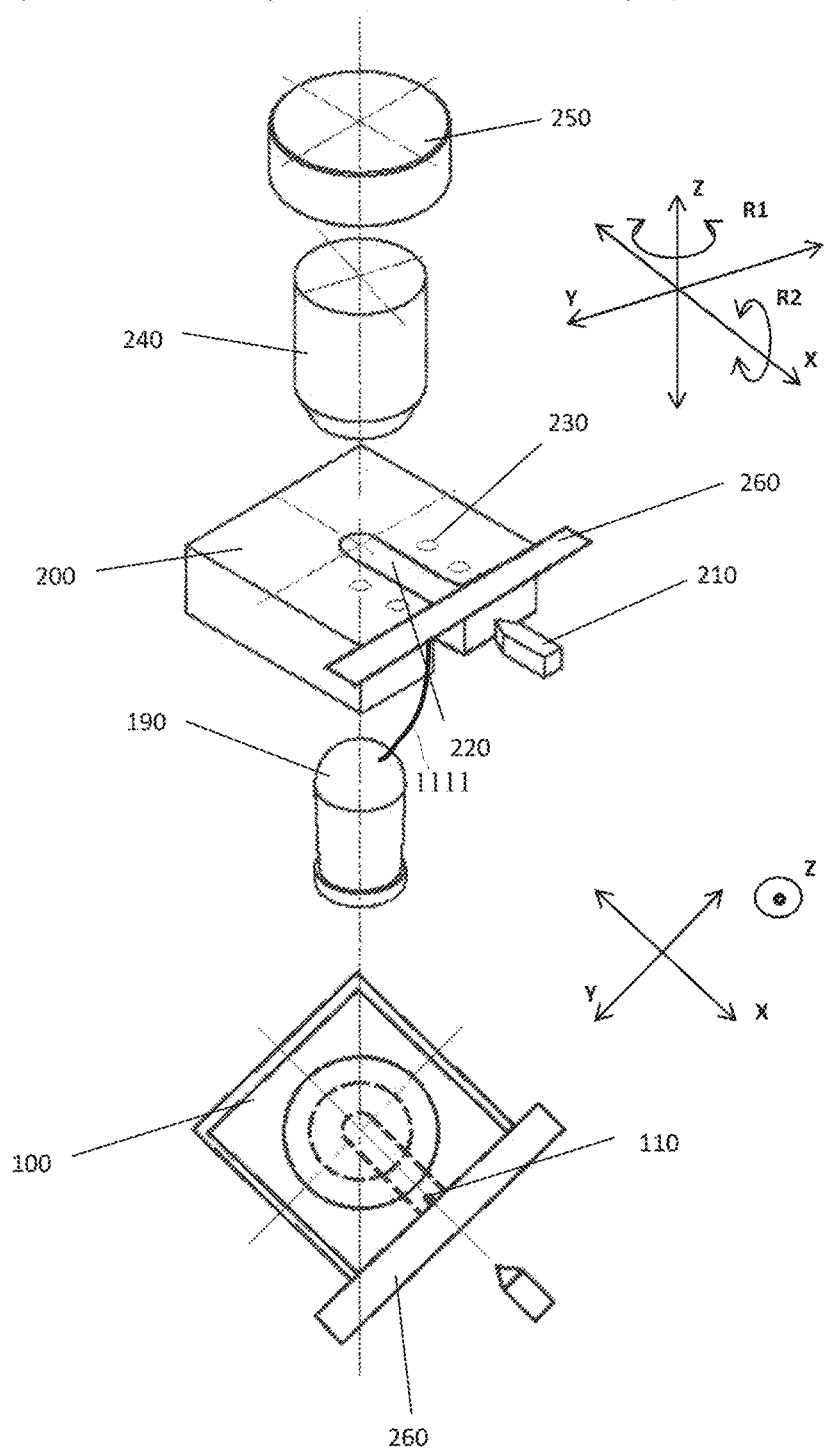
Fig.4, Schematic and top view of the device for realizing of presented invention

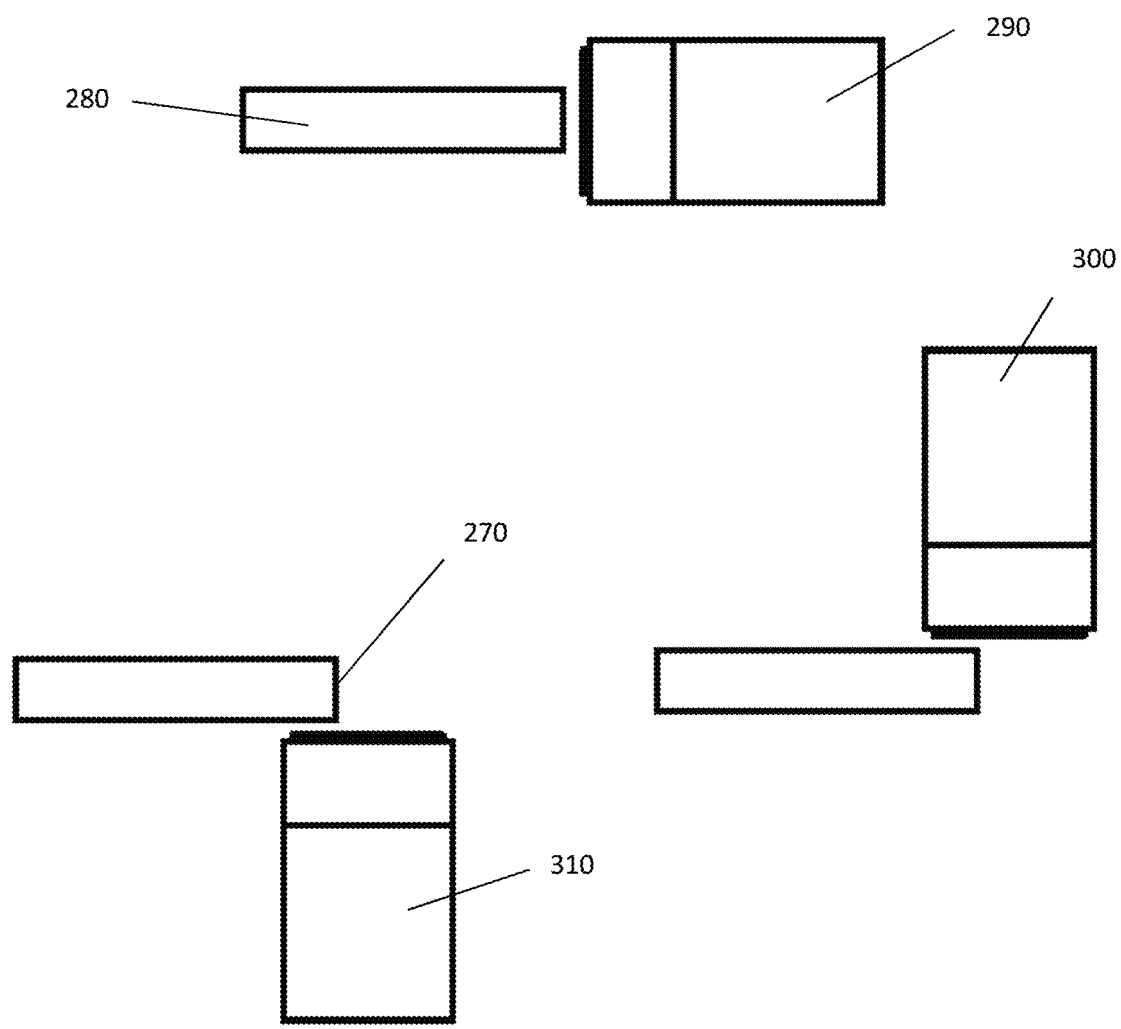
Fig.5, Illustration of possible locations of the knife to edge of sample

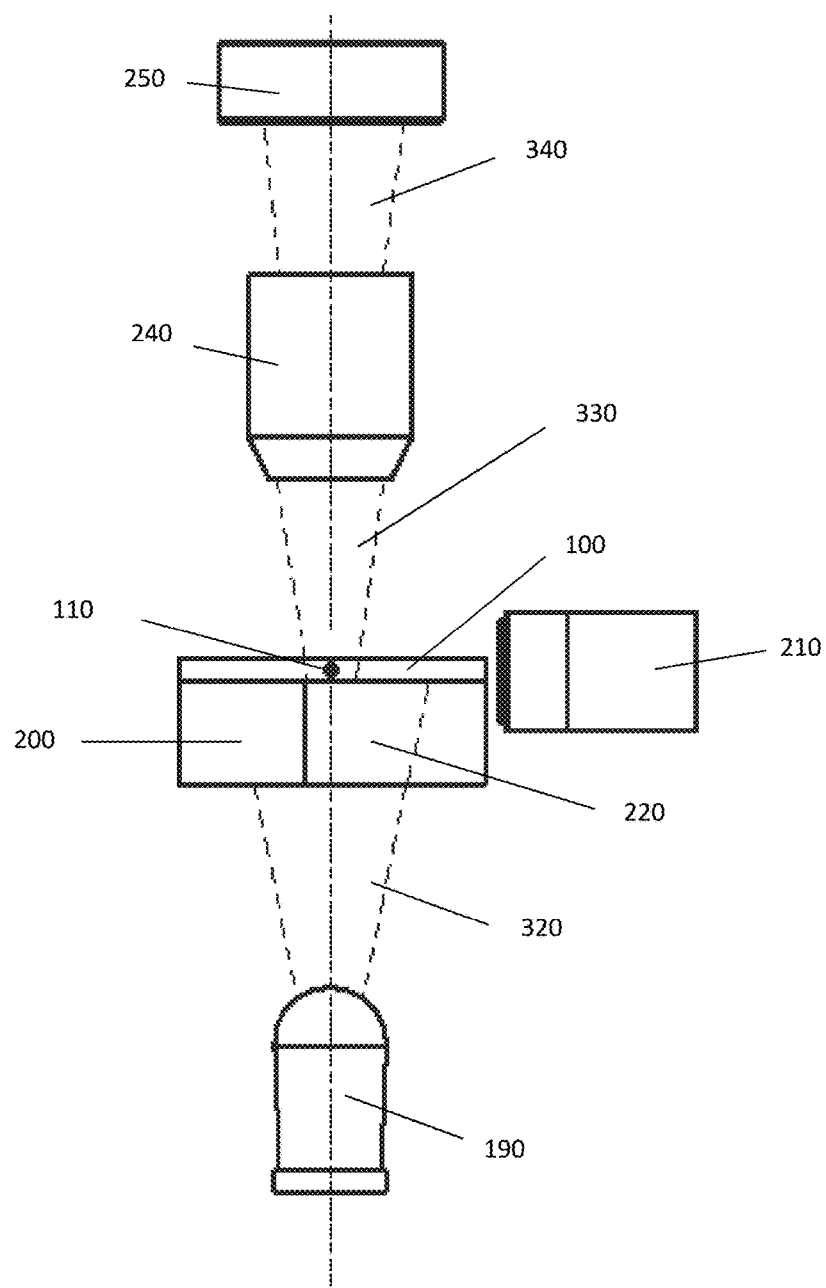
Fig.6, Illustration of the light passing through the sample in a case of the chuck with stripped hole Fig.7, Illustration of the light passing through the sample in a case of the chuck from IR transparent material
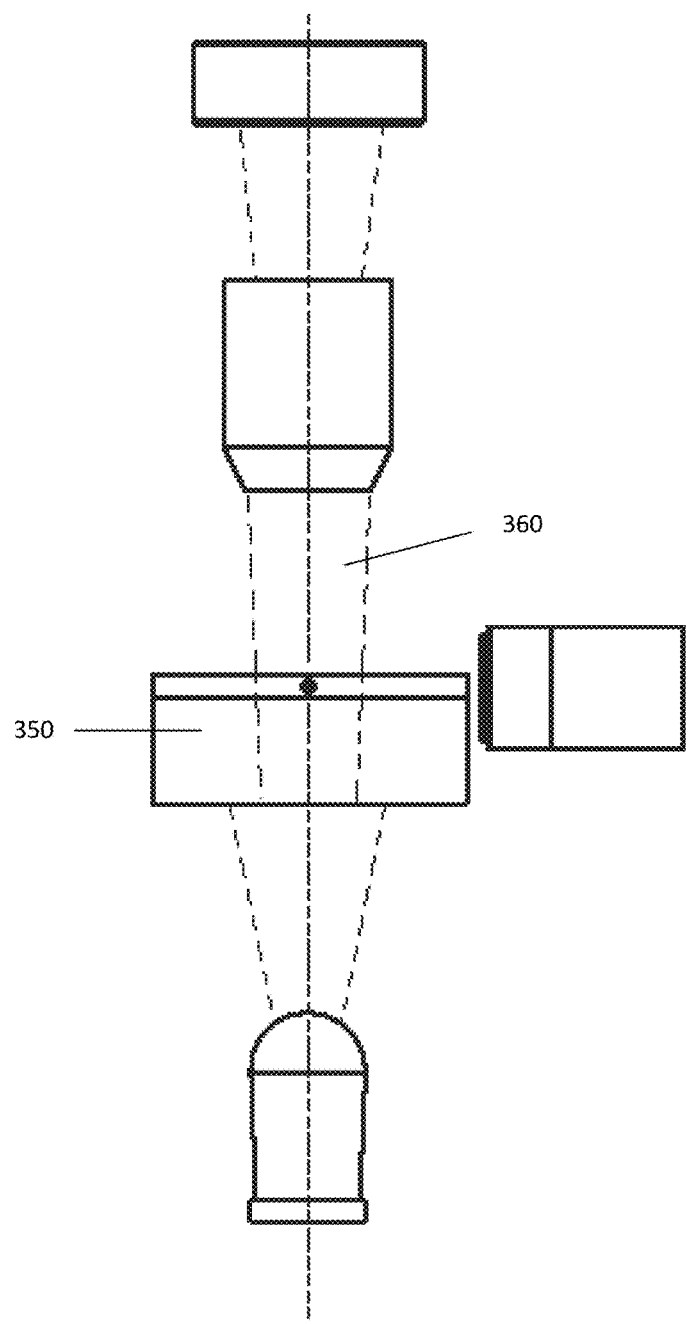

Fig.8, Visualization of results of the cleaving of defect in wafer substrate
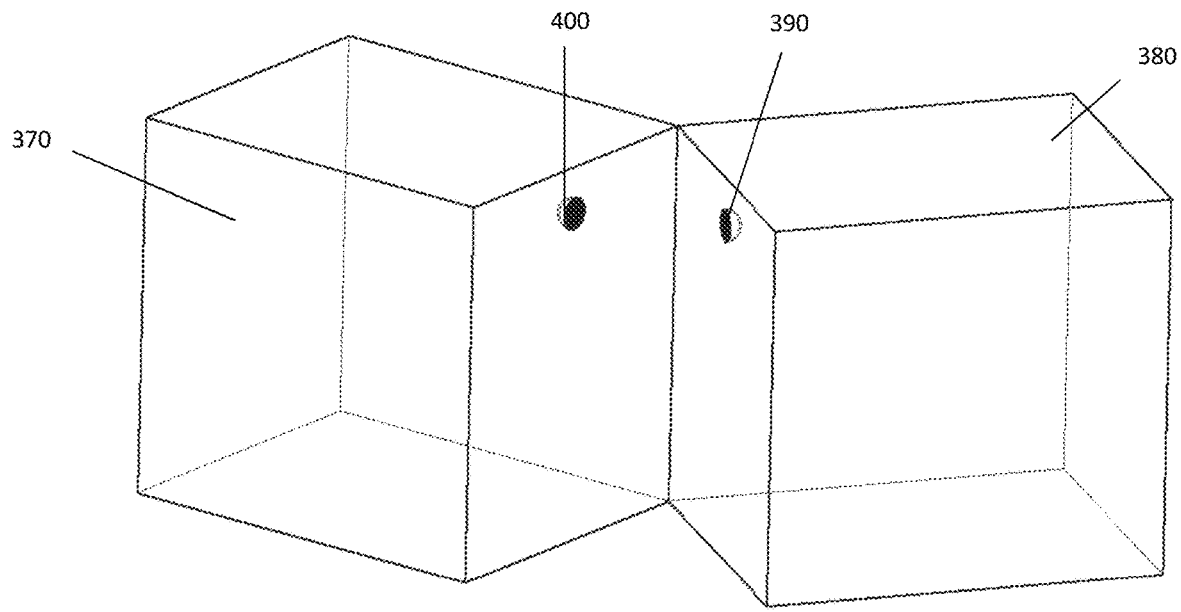
Fig.9, Visualization of results of cleaving of defect in lithography layers on silicon substrate
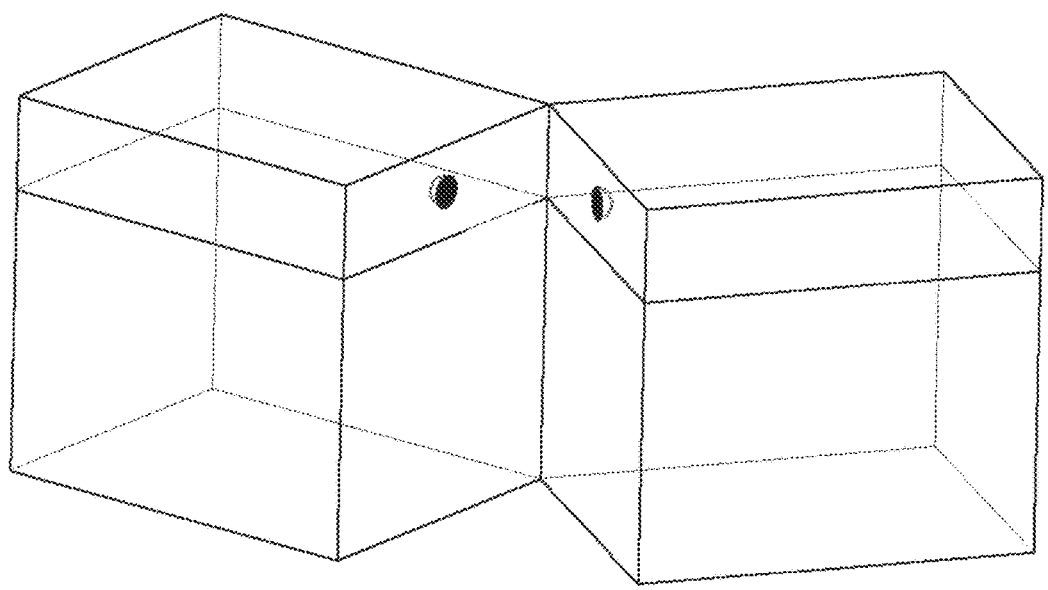

Fig.10, Visualization of results of cleaving of defect in multi-stack semiconductor device
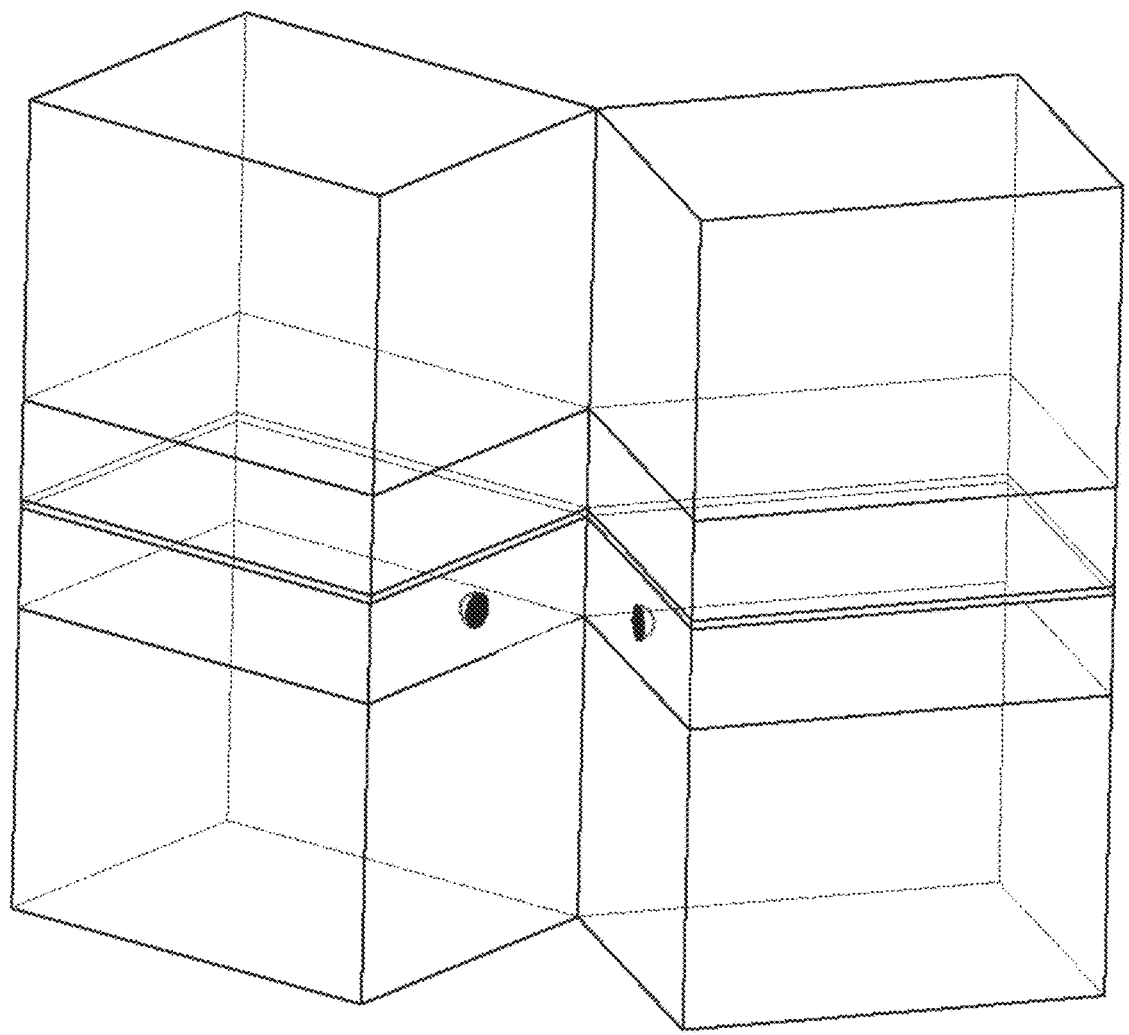

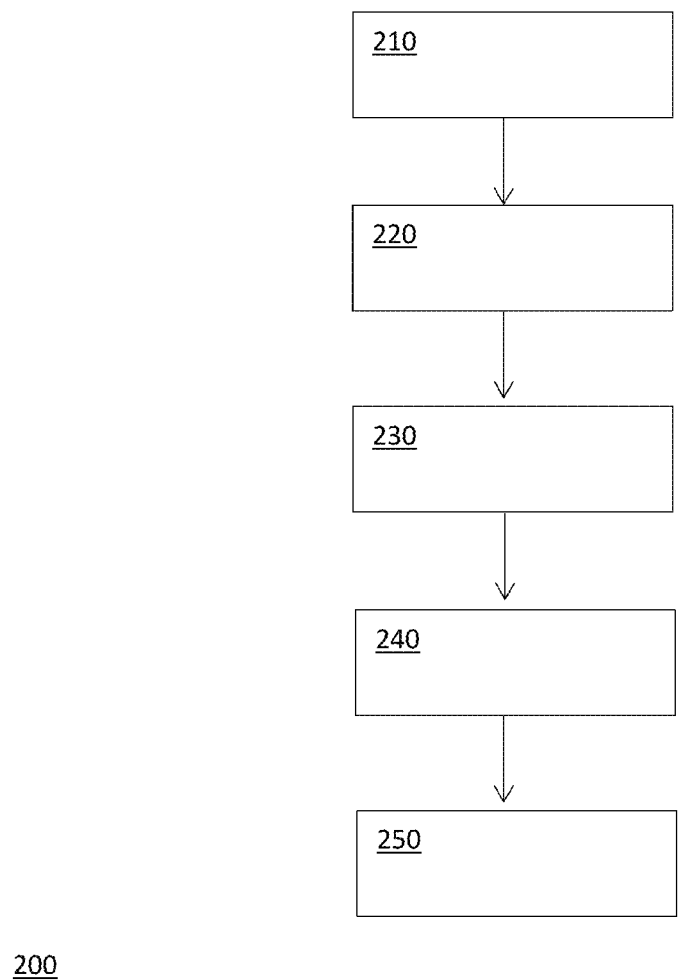
Fig.11, Example of method

SYSTEM AND METHOD OF CLEAVING OF BURIED DEFECTS

BACKGROUND

Sample preparation of buried defects is problematic as the buried defect is not visible. Typically, in order to expose the buried defect a large area of the object is removed until the buried defect is exposed. This may damage the object and is not efficient.

These is a growing need to provide an efficient method and system for preparing a sample that exposes a buried defect.

SUMMARY

There is provided a method and device for preparing samples that expose buried defects. The object is illuminated with radiation that has an infrared component and is observed by an imaging device that has a known (and preferably constant) spatial relationship with a cleaving element. For example—imaging device and the cleaving unit may be aligned so that a cleaving axis of the cleaving unit may be virtually cross the optical axis of the inspection device. Once a buried defect is detected then the location of the cleaving line is known and the object may be cleaved along the cleaving line to expose the buried defect. When the imaging device and the cleaving unit are aligned the cleaving may be done without even moving the object, the cleaving device or the imaging device. Alignment may be achieved when the cleaving axis of the cleaving unit is within the field of view of the inspection device and once a cleaving along the axis is required a relative movement may be performed in order to align the cleaving axis with the the buried defect—so that the cleaving (along the cleaving axis) will expose the buried defect.

Generally, the method is oriented to failure analysis of defects in wafer substrates (FIG. 1 wafer substrate defect), defects in lithography layers on silicon substrate (FIG. 2, defect in lithography layers on silicon substrate) and defect in multi-stack semiconductor device (FIG. 3, defect in multi-stack semiconductor device). Commonly defect is located at some depth and cannot be detected in visible light. In case of multi-stack semiconductor devices sample can be presented as combination of silicon substrates with lithography layers connected by active areas, or when silicon substrates with structures connected by silicon sides and opposite lithography layers has TSV interconnection.

A device may be provided and may include a chuck, apparatus for cleaving of sample, light source which locates under the chuck, shutter, optical device and registration devices locates above the chuck (FIG. 4, schematic and top view of the device for realizing of presented invention). The light source is infrared light source, or any light source containing an infrared range in its spectrum. The light source can move in three directions X, Y and Z. The optical device and the registration device are capable of forming an infrared image. The optical device can move in three directions X, and Z. The chuck is presented by plate with good polished top surface with stripped through hole and a few holes connected to air pump which uses difference of atmospheric pressure for a sample grasping. Chuck plate can be produced from infrared light transparent material. The chuck can move in five directions X, Y, Z, R1 and R2. The through stripped hole is coaxial with light source, optical and registration devices. The shutter is locates above the chuck and it is combined with edge of sample through which a cleaving will be realized. The shutter blocks a part of initial light which bends (see line 1111 of FIG. 4) around the edge of the sample. The bended light includes non-infrared component which able to worse a quality of image from registration device. The shutter is most helpful when a target locates close to edge from which cleave will be realized. The shutter can move in three directions X, Y and Z. Generally apparatus for cleaving is presented by knife. The knife can be locates front of edge of sample, under the edge of sample and above the edge of sample (FIG. 5, illustration of possible positions of the knife to the edge of sample). A changing of the knife locations has an influence on a quality and accuracy of the cleave Initial sample is placed on the chuck so that one edge is faced to the knife. The light emitted from the light source passes through the hole in the chuck or through the IR transparent material of the chuck and illuminates the sample from it bottom side. Infrared component of the light passes through the sample and then it is collected by the optical device which supplies the IR component to registration device. Finally the registration device forms image of the defect (FIG. 6, illustration of the light passing through the sample in a case of the chuck with stripped hole; FIG. 7, illustration of the light passing through the sample in a case of the chuck from IR transparent material). Based on the image operator identifies location of the area of interest and aligns the sample so that the crack will pass through the buried defect. Finally step is cleaving (FIG. 8, visualization of results of the cleaving of buried defect in wafer substrate; FIG. 9, visualization of results of cleaving of defect in lithography layers on silicon substrate; FIG. 10, visualization of results of cleaving of defect in multi-stack semiconductor device).

There may be provided a method of cleaving of buried defects, the method may include: detecting buried defect location by using infrared light; cleaving of the sample through the buried defect;

The light source may be an infrared light source.

The light source may include an infrared range in its spectrum.

The registration device may be configured to detect infrared light and visualize the information that it carries.

The light source may be located under the sample

The light source may be located above the sample.

The area of interest may be located on edge of sample.

The knife may be located front of the cleaved edge of sample.

The knife may be located under of the cleaved edge of sample.

The knife may be located below of the cleaved edge of sample.

The chuck can move in five directions.

The shutter can move in three directions.

The light source can move in three directions.

The the optical device can move in three directions.

BRIEF DESCRIPTION OF THE DRAWINGS

In order to understand the invention and to see how it may be carried out in practice, a preferred embodiment will now be described, by way of non-limiting example only, with reference to the accompanying drawings.

FIG. 1 illustrates a buried defect;
FIG. 2 illustrates a buried defect;
FIG. 3 illustrates a buried defect;
FIG. 4 illustrates an example of a system;
FIG. 5 illustrates an example of parts of a system;

FIG. 6 illustrates an example of a system;

FIG. 7 illustrates an example of a system;

FIG. 8 illustrates an exposed defect that was previously a buried defect;

FIG. 9 illustrates an exposed defect that was previously a buried defect;

FIG. 10 illustrates an exposed defect that was previously a buried defect; and

FIG. 11 illustrates an example of a method.

DETAILED DESCRIPTION OF THE DRAWINGS

Any reference to a system should be applied, mutatis mutandis to a method that is executed by a system.

Any reference to method should be applied, mutatis mutandis to a system that is configured to execute the method The term "and/or" is additionally or alternatively.

FIG. 1 illustrates defect 110 buried in wafer substrate 100.

FIG. 2 illustrates defect 110 buried in lithography layers 120 locates on silicon substrate 130

FIG. 3 illustrates defect 110 buried in lithography layers one of multi-stack semiconductor devices. For visualization the multi-substrate device presented here by top silicon substrate 140 with lithography layers 150 and bottom silicon substrate 180 with lithography layers 170. The opposite lithography layers are connected by intermediate layer 160.

FIG. 4, shows schematic and top views of a system.

The system may include a chuck 200 with striped through hole 220 and few holes 230 connected to air pump, a radiation source such as a light source 190 locates under the chuck, a cleaving element such as a knife 210, shutter 260, optical device such as objective lens 240 and a sensor such as the registration device 250 which locates above the chuck. The top view illustrates a case when defect 110 locates close to edge of sample. The object (not shown) is placed on the chuck.

The cleaving element may cleave the object by hitting the object. The cleaving element may be moved manually and/or using a movement mechanism (not shown).

FIG. 5 illustrates possible locations of knife to edge 270 of sample 280. Here the knife is located in front of the cleaved edge 290, or above the cleaved edge 300 or under the cleaved edge 310.

FIG. 6 illustrates how illuminated light 320 from light source 190 passes through an aperture such as a stripped hole 220 in chuck. Some of the illuminated light may be reflected from a bottom surface of sample 100 and just IR components 330 passes through the sample and then it is collected by optical device 240. Optical device transfers part of IR component 340 (detected illumination) to registration device 250.

FIG. 7 illustrates how initial light from light source falls on a bottom surface of the chuck 350 which produced from IR transparent material. IR component 360 passes through the chuck and then it is collected by optical device.

FIG. 8, shows result of the cleaving of defect in wafer substrate. The wafer substrate splits into two parts. One part 370 contains part of defect 400 and second part 380 contains some part 390 of the defect too.

FIG. 9 shows result of cleaving of defect in lithography layers on silicon substrate.

FIG. 10 shows result of cleaving of defect in multi-stack semiconductor device.

FIG. 11 illustrates method 200.

Method 200 may include a sequence of steps 210, 220, 230, 240 and 250.

Step 210 may include aligning the cleaving element and the sensor. This may be done by positioning the cleaving axis to be within a field of view of the sensor.

Step 220 may include illuminating, by a radiation source, an object that comprises the buried defect, with illuminating radiation that passes through a radiation transparent part of the chuck, while the object is supported by the chuck. The radiation transparent part of the chuck may be an aperture or a material that is transparent to radiation that may be used for detecting the buried defect.

Step 230 may include detecting, by a sensor, a detected radiation that passed through the object, to provide a visual indication about the buried defect, wherein the visual indication is indicative of a location of the buried defect. The detection may include processing the detection signals generated by the sensor. This may include image processing.

Step 240 may include setting, based on the location of the buried object and a spatial relationship between a cleaving element and the sensor, a cleaving axis of a cleaving element to virtually cross the buried defect. The setting may or may not include introducing a movement between the cleaving element and the object. Any one of the cleaving element and the object may be moved.

Step 250 may include cleaving, by the cleaving element, the object to expose the buried object.

The object may include silicon and the illumination radiation may include an infrared portion.

The optical axis of the sensor may be normal to the chuck and may be normal to the cleaving axis. Other angular relationships may be provided.

The method may include introducing a movement between the object and the sensor while the illuminating of the object. This may allow to inspect different parts of the object when searching for one or more buried defect.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

The phrase "may be X" indicates that condition X may be fulfilled. This phrase also suggests that condition X may not be fulfilled. For example—any reference to a system as including a certain component should also cover the scenario in which the system does not include the certain component. For example—any reference to a method as including a certain step should also cover the scenario in which the method does not include the certain component. Yet for another example—any reference to a system that is configured to perform a certain operation should also cover the scenario in which the system is not configured to perform the certain operation.

The terms "including", "comprising", "having", "consisting" and "consisting essentially of" are used in an interchangeable manner. For example—any method may include at least the steps included in the figures and/or in the specification, only the steps included in the figures and/or the specification. The same applies to the system and the mobile computer.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one as or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements the mere fact that certain measures are recited in mutually different claims does not indicate that a combination of these measures cannot be used to advantage.

Any system, apparatus or device referred to this patent application includes at least one hardware component.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

Any combination of any component of any component and/or unit of system that is illustrated in any of the figures and/or specification and/or the claims may be provided.

Any combination of any system illustrated in any of the figures and/or specification and/or the claims may be provided.

Any combination of steps, operations and/or methods illustrated in any of the figures and/or specification and/or the claims may be provided.

We claim:

1. A method for failure analysis of a buried defect that is buried within an object, the method comprises:
    illuminating the object with illuminating radiation and by a radiation source, the illuminating radiation passes through a radiation transparent part of a chuck, while the object is supported by the chuck;
    detecting a location of the buried defect based on detected radiation sensed by a sensor, the detected radiation passed through the object;
    determining whether a cleaving axis of a cleaving element virtually passes through the buried defect;
    when determining that the cleaving axis does not virtually pass through the buried defect, moving at least one of the object and the cleaving element to have the cleaving axis pass through the buried defect; and
    cleaving, by the cleaving element, the object to expose the buried defect; and
    wherein prior to the cleaving, the buried defect does not reach any external surface of the object.

2. The method according to claim 1 wherein the radiation transparent part of the chuck is an aperture or a slot.

3. The method according to claim 1, comprising maintaining positions of the cleaving element and the object when determining that the cleaving axis virtually passes through the buried defect.

4. The method according to claim 1, wherein the object comprises silicon and wherein the illumination radiation comprises an infrared portion.

5. The method according to claim 1, wherein the illuminating is preceded by aligning the cleaving element and the sensor.

6. The method according to claim 1, wherein the illuminating is preceded by aligning the cleaving element and the sensor by positioning the cleaving axis to be within a field of view of the sensor.

7. The method according to claim 1, wherein an optical axis of the sensor is normal to the chuck and is normal to the cleaving axis.

8. The method according to claim 1, wherein an optical axis of the sensor is normal to the chuck and is coaxial to the cleaving axis.

9. The method according to claim 1, wherein the cleaving provides an exposed defect, wherein the method further comprises analyzing the exposed defect.

10. The method according to claim 1 wherein the cleaving comprises splitting the object to parts, wherein at least one part comprises an exposed part of the buried defect.

11. The method according to claim 1 wherein prior to the cleaving, the buried defect is not visible to visual light.

12. The method according to claim 1 comprising blocking, by a shutter, light that bends around an edge of the object.

13. The method according to claim 12 wherein the edge of the object faces the cleaving element.

14. The method according to claim 13 wherein the shutter is positioned above the edge of the object.

* * * * *